(12) United States Patent
Watanabe et al.

(10) Patent No.: US 9,023,593 B2
(45) Date of Patent: May 5, 2015

(54) METHOD OF MANUFACTURING LIQUID EJECTION HEAD

(71) Applicant: Canon Kabushiki Kaisha, Tokyo (JP)

(72) Inventors: Makoto Watanabe, Yokohama (JP); Yoshinori Tagawa, Yokohama (JP); Hiroyuki Murayama, Yokohama (JP); Toshiaki Kurosu, Oita (JP); Masataka Nagai, Yokohama (JP); Takanobu Manabe, Kawasaki (JP)

(73) Assignee: Canon Kabushiki Kaisha, Tokyo (JP)

( * ) Notice: Subject to any disclaimer, the term of this patent is extended or adjusted under 35 U.S.C. 154(b) by 0 days.

(21) Appl. No.: 14/287,611

(22) Filed: May 27, 2014

(65) Prior Publication Data

US 2014/0361458 A1   Dec. 11, 2014

(30) Foreign Application Priority Data

Jun. 10, 2013   (JP) .................................. 2013-121538

(51) Int. Cl.
| | |
|---|---|
| *B41J 2/05* | (2006.01) |
| *B29C 59/00* | (2006.01) |
| *G03F 7/20* | (2006.01) |
| *B41J 2/16* | (2006.01) |

(52) U.S. Cl.
CPC .............. *B29C 59/00* (2013.01); *G03F 7/2002* (2013.01); *B41J 2/1631* (2013.01); *B41J 2/1639* (2013.01)

(58) Field of Classification Search
CPC ...... B41J 2/1631; B41J 2/1639; G03F 7/2002
USPC ......................................................... 430/320
See application file for complete search history.

(56) References Cited

U.S. PATENT DOCUMENTS

| | | | |
|---|---|---|---|
| 8,652,767 B2 | 2/2014 | Watanabe et al. | |
| 2004/0036744 A1* | 2/2004 | Cho et al. ......................... | 347/65 |
| 2006/0172227 A1* | 8/2006 | Shaarawi et al. ............. | 430/311 |
| 2009/0162797 A1 | 6/2009 | Tsuji et al. | |
| 2013/0149648 A1* | 6/2013 | Manabe et al. ............... | 430/320 |
| 2013/0152391 A1 | 6/2013 | Ishimatsu et al. | |

FOREIGN PATENT DOCUMENTS

JP   2009-166492 A   7/2009

* cited by examiner

*Primary Examiner* — John A McPherson
(74) *Attorney, Agent, or Firm* — Fitzpatrick, Cella, Harper & Scinto

(57) ABSTRACT

Provided is a method of manufacturing a liquid ejection head, including: forming, on a substrate, a flow path mold pattern that becomes a mold of a liquid flow path; forming a negative photosensitive resin layer on the flow path mold pattern; subjecting the negative photosensitive resin layer to exposure processing with use of a reduction projection exposing apparatus and a mask pattern having an ejection orifice mask shape for forming ejection orifices; and subjecting the negative photosensitive resin layer obtained after the exposure processing to development processing to form the ejection orifices, in which the ejection orifices are formed by correcting, by the ejection orifice mask shape, an inclination of an ejection angle due to an off-axis telecentricity caused by the reduction projection exposing apparatus so as to be close to a direction perpendicular to a surface of the substrate.

6 Claims, 7 Drawing Sheets

DIRECTION OF OFF-AXIS
TELECENTRICITY

DIRECTION OF OFF-AXIS TELECENTRICITY

METHOD OF MANUFACTURING LIQUID EJECTION HEAD

BACKGROUND OF THE INVENTION

1. Field of the Invention

The present invention relates to a method of manufacturing a liquid ejection head that ejects liquid such as ink based on an ink jet system to perform recording onto a recording medium.

2. Description of the Related Art

As an example of using a liquid ejection head that ejects liquid, there is known an ink jet recording system that performs recording by ejecting liquid such as ink onto a recording medium. As an example of manufacturing a liquid ejection head that employs the ink jet recording system, there is known a method disclosed in Japanese Patent Application Laid-Open No. 2009-166492.

In this document, there is disclosed a method of manufacturing a liquid ejection head including a substrate including energy generating elements for generating energy to be used for ejecting liquid from ejection orifices, an ejection orifice forming member that forms the ejection orifices, and a flow path that is communicated to the ejection orifices.

As the specific manufacturing method, a positive photosensitive resin layer containing a light absorbing material is formed on a substrate, and the positive photosensitive resin layer is exposed with light, to thereby form a flow path mold pattern. Next, a negative photosensitive resin layer that becomes the ejection orifice forming member is formed to cover the flow path mold pattern, and the negative photosensitive resin layer is exposed with i-line light, to thereby form the ejection orifices. Then, the positive photosensitive resin is removed to form the flow path that is communicated to the ejection orifices.

In Japanese Patent Application Laid-Open No. 2009-166492, the following is described. The negative photosensitive resin is exposed with i-line light to form fine ejection orifices, and thus ejection orifices having a satisfactory circular shape can be reproducibly obtained with ease.

SUMMARY OF THE INVENTION

According to one embodiment of the present invention, there is provided a method of manufacturing a liquid ejection head including: a substrate including energy generating elements for generating energy so as to eject liquid; ejection orifices for ejecting the liquid; and a liquid flow path communicated to the ejection orifices, the method including: forming, on the substrate, a flow path mold pattern that is formed as a mold of the liquid flow path; forming a negative photosensitive resin layer on the flow path mold pattern; subjecting the negative photosensitive resin layer to exposure processing with use of a reduction projection exposing apparatus and a mask pattern having an ejection orifice mask shape for forming the ejection orifices; and subjecting the negative photosensitive resin layer obtained after the exposure processing to development processing to form the ejection orifices, in which the ejection orifices are formed by correcting, by the ejection orifice mask shape, an inclination of an ejection angle due to an off-axis telecentricity caused by the reduction projection exposing apparatus so as to be close to a direction perpendicular to a surface of the substrate.

Further features of the present invention will become apparent from the following description of exemplary embodiments with reference to the attached drawings.

DESCRIPTION OF THE EMBODIMENTS

When a negative photosensitive resin layer is exposed with i-line light in order to form ejection orifices, a reduction projection exposing apparatus is used.

Figure 2:
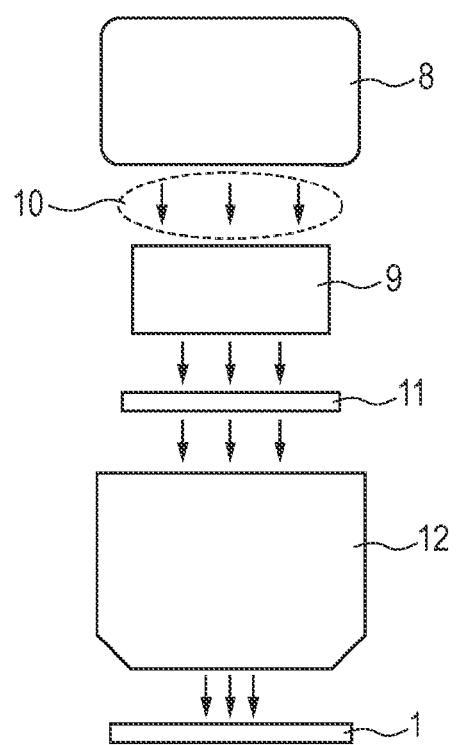
FIG. 2 is a schematic view illustrating a reduction projection exposing apparatus and an exposure state.

FIG. 2 is a schematic view of the reduction projection exposing apparatus. The reduction projection exposing apparatus illustrated in FIG. 2 includes a light source 8 such as a mercury lamp, an illumination optical system 9 for illuminating a reticle 11 with use of light beams 10 from the light source 8, and a reduction projection optical system 12 for projecting the pattern of the reticle 11 onto a substrate 1. The light beam 10 radiated in the vicinity of the outer periphery of the reticle 11 tends to have an incident angle with respect to a direction perpendicular to the surface of the substrate 1, which is slightly larger than that of the light beam 10 radiated in the vicinity of the center of the reticle 11.

This tendency may occur in principle in the reduction projection optical system, and is called a telecentric property.

The ejection orifice pattern arranged in the vicinity of the outer periphery of the reticle 11 is projected onto the substrate 1 with an inclination of a light beam radiated onto the ejection orifice pattern due to the telecentric property. Therefore, the ejection orifice corresponding to the ejection orifice pattern arranged in the vicinity of the outer periphery of the reticle 11 is formed in an inclined manner. Therefore, the liquid droplet ejected from the ejection orifice may land at a position misaligned from the ideal landing position. As a result, the liquid droplet is ejected in an outwardly inclined manner due to the inclination of the ejection orifice in the vicinity of both end portions of the ink jet recording head, and thus the total printing pitch expands.

When an image is formed by scanning the ink jet recording head having such ejection orifices for multiple times to eject liquid droplets onto the recording medium, in the vicinity of a boundary of adjacent scanning regions, as described above, the landing position misalignment occurs due to the inclination of the ejection orifice in the vicinity of both the end portions of the ink jet recording head. As a result, a darker color portion may be generated in the vicinity of the boundary between the scanning regions, and this portion may appear as a streak to reduce the image quality.

In view of this, the present invention has an object to provide a method capable of manufacturing a liquid ejection head while suppressing an inclination of an ejection direction of an ejection orifice caused by the off-axis telecentricity when a reduction projection exposing apparatus is used.

Now, embodiments of present invention are described with reference to the drawings.

A liquid ejection head according to the present invention can be mounted on a printer, a copying machine, a fax machine having a communication system, an apparatus such as a word processor including a printer portion, and further, an industrial recording apparatus integrated with a processing apparatus of various kinds. By using the liquid ejection head, recording can be performed on various kinds of recording media such as paper, thread, fabric, leather, metal, plastic, glass, wood, and ceramics. Note that, "recording" as used herein means not only giving a meaningful image such as a letter or a shape but also giving a meaningless image such as a pattern to a recording medium. Further, "liquid" as used herein shall be broadly construed, and means liquid which is, by being given onto a recording medium, available for formation of an image, a pattern, or the like, processing of a recording medium, or treatment of ink or a recording medium. The treatment of ink or a recording medium includes, for example, improvement in fixing property by solidification or insolubilization of a coloring material in ink given to a recording medium, improvement in recording quality or color reproducing performance, and improvement in image durability.

Further, in the following description, an ink jet recording head is taken as a main example of a liquid ejection head to which the present invention is applied, but the application range of the present invention is not limited thereto. The present invention may also be applied to a method of manufacturing a liquid ejection head for producing a biochip or for printing an electronic circuit in addition to an ink jet recording head. The present invention may also be applied to, for example, a method of manufacturing a liquid ejection head for manufacturing a color filter.

Note that, in the following description, configurations having like functions are denoted by like reference symbols throughout the drawings, and description thereof may be omitted.

Figure 1:
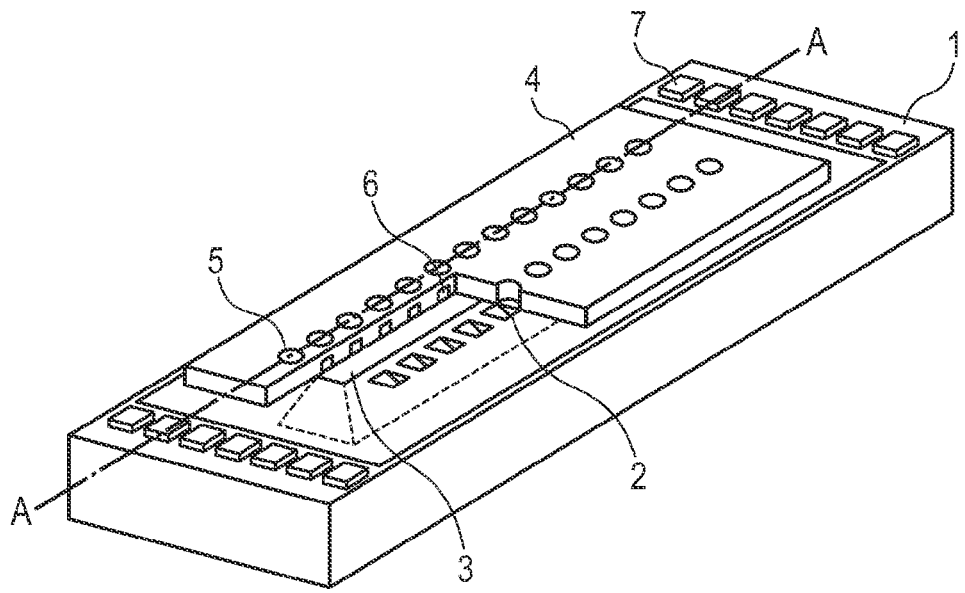
FIG. 1 is a schematic perspective view illustrating a configuration example of an ink jet recording head.

FIG. 1 is a schematic perspective view illustrating a structure of an ink jet recording head according to an embodiment of the present invention. In FIG. 1, on the substrate 1, energy generating elements 2 for generating energy for ejecting liquid such as ink are arrayed at predetermined pitches along the longitudinal direction of the substrate 1. Ejection orifices 5 are arranged above the energy generating elements 2, respectively, and the multiple ejection orifices 5 are arrayed to form ejection orifice rows. Two ejection orifice rows are arranged on the substrate, and a supply port (ink supply port) 3 formed by subjecting the substrate 1 to anisotropic etching is opened between the two ejection orifice rows. The multiple ejection orifices 5 are formed so as to correspond to the respective energy generating elements 2 by an ejection orifice forming member 4 provided on the substrate 1. In this embodiment, the ejection orifice forming member 4 also functions as a flow path forming member for forming an individual liquid flow path (ink flow path) 6 communicated from the ink supply port 3 to the respective ejection orifices 5.

In such an ink jet recording head of this embodiment, an orifice surface having the ejection orifices 5 formed therein is arranged so as to oppose a recording surface of the recording medium. Then, energy generated by the energy generating elements 2 is applied to the ink filled inside the ink flow path 6 through the ink supply port 3, to thereby eject ink droplets from the ejection orifices 5. The ink droplets are caused to adhere on the recording medium to perform recording.

Next, a method of manufacturing an ink jet recording head illustrated in FIG. 1 according to an embodiment of the present invention is described.

First, a flow path mold pattern that becomes a mold for the ink flow path is formed on the substrate (for example, silicon substrate).

For example, on a first surface (front surface) of the substrate 1 including the energy generating elements 2, a positive photosensitive resin layer is formed. The positive photosensitive resin layer is patterned by photolithography, to thereby form the flow path mold pattern.

Next, on the flow path mold pattern, a negative photosensitive resin layer that becomes the ejection orifice forming member 4 is formed.

For example, on the flow path mold pattern and the substrate, the negative photosensitive resin layer is applied and arranged so as to cover the flow path mold pattern.

Next, the reduction projection exposing apparatus is used to subject the negative photosensitive resin layer to exposure processing.

In the present invention, the inclination of the ejection angle due to the off-axis telecentricity caused by the reduction projection exposing apparatus is corrected so as to be close to a direction perpendicular to the substrate surface by means of an ejection orifice mask shape of a mask pattern.

As exposure light, for example, i-line light can be used.

Next, the negative photosensitive resin layer obtained after the exposure processing is subjected to development processing, to thereby form the ejection orifice forming member 4 having the ejection orifices.

Next, as necessary, the ejection orifice forming member is covered with a protective film, and then the substrate is subjected to anisotropic etching from a second surface (back surface) side, which is a surface on the opposite side to the first surface, to thereby form the ink supply port 3.

Next, the flow path mold pattern is dissolved and removed, to thereby form the ink flow path 6.

With the above-mentioned steps, the ink jet recording head can be manufactured.

Note that, after that, the substrate can be cut by a dicer or the like to obtain the individual ink jet recording head. Further, the individual ink jet recording head can be electrically connected to contact pads 7.

Next, the reduction projection exposing apparatus used in this embodiment is described.

FIG. 2 is a schematic view illustrating the configuration of the reduction projection exposing apparatus that subjects the negative photosensitive resin layer that becomes the ejection orifice forming member 4 to exposure processing so as to form the fine ejection orifices 5 of the ink jet recording head. In FIG. 2, the reduction projection exposing apparatus includes the illumination optical system 9 for illuminating the reticle 11 with use of the light beams 10 generated from the light source 8, and the reduction projection optical system 12 for projecting the pattern of the reticle 11 onto the negative photosensitive resin layer. As the light source, for example, a high pressure mercury vapor lamp can be used. Among light beams radiated from the high pressure mercury vapor lamp, i-line light can be used for exposure. The light source is not particularly limited, and only needs to be a light source that can radiate a light beam with a photosensitive wavelength for the negative photosensitive resin.

In the reduction projection optical system, distortion occurs when defocusing is performed from the best focus. The magnification of distortion changes depending on the level of defocusing. In this specification, this magnification of distortion is defined as off-axis telecentricity. The telecentric property generally represents the degree of collimation of the main light beam with respect to the optical axis of the optical system.

In general, the off-axis telecentricity tends to occur stronger in the light beam 10 that passes through the vicinity of the edge of the lens than in the light beam 10 that passes through the vicinity of the center of the lens. In other words, in the case of the optical system as illustrated in FIG. 2, the off-axis telecentricity of the light beam radiated in the vicinity of the outer periphery of the reticle 11 tends to be larger than the off-axis telecentricity of the light beam radiated in the vicinity of the center of the reticle 11. More specifically, when exposure is performed while the center of the lens and the center of the reticle are arranged in alignment, the off-axis telecentricity of the light beam radiated in the vicinity of the outer periphery of the reticle 11 tends to be larger than the off-axis telecentricity of the light beam radiated in the vicinity of the center of the reticle 11.

When the off-axis telecentricity increases, the light beam that has passed through the reticle is inclined with respect to the direction perpendicular to the substrate surface.

Figure 3:
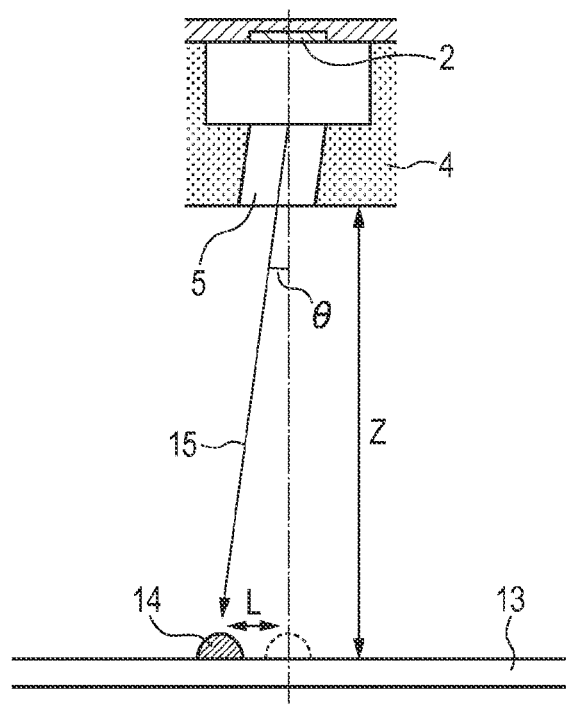
FIG. 3 is a schematic sectional view illustrating an inclination of an ejection angle of an ejection orifice formed by being exposed with an inclined light beam from the reduction projection exposing apparatus.

As illustrated in FIG. 3, the ejection orifice 5 formed by being exposed with the inclined light beam is formed to be inclined with respect to the direction perpendicular to the substrate surface. Therefore, a liquid droplet 14 to be ejected from the ejection orifice 5 is ejected in an inclined manner with respect to a recording medium 13 due to an inclination angle of the ejection orifice 5. Therefore, the liquid droplet 14 lands at a position misaligned from an ideal landing position (position in the perpendicular direction from the ejection orifice). When a distance from the ejection orifice 5 to the recording medium 13 is represented by Z, a landing position misalignment amount L from the ejection direction 15 is represented by $L = Z \tan \theta$. Note that, in FIG. 3, the ejection orifice has an opening on the substrate surface side and an opening on the orifice surface side. L represents a distance between a center of the opening on the substrate surface side and the landing position in the horizontal direction (surface direction).

Figure 4:
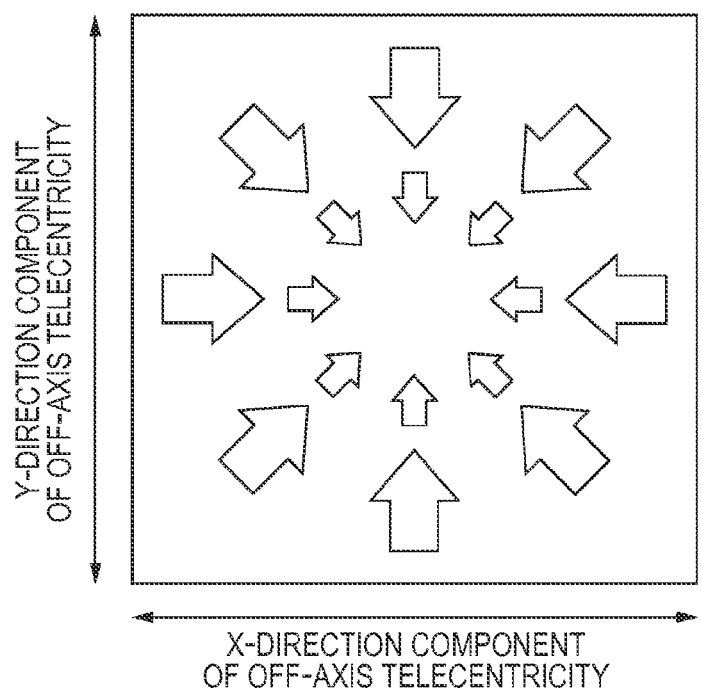
FIG. 4 is an image diagram illustrating the direction and size of an off-axis telecentricity on a reticle.

FIG. 4 is an image diagram illustrating the off-axis telecentricity on the reticle 11. In general, the lens center and the reticle center are arranged in alignment, and the off-axis telecentricity is caused by the optical system of the exposing apparatus. Therefore, the off-axis telecentricity increases toward the outer periphery from the center of the reticle. Then, the ejection orifice 5 formed by a light beam that has passed through the vicinity of the outer periphery of the reticle has a large inclination angle. In other words, the ejection orifice in the vicinity of the end portion of the ejection orifice row is formed by the light beam that has passed through the vicinity of the outer periphery of the reticle, and hence the ejection orifice in the vicinity of the end portion of the ejection orifice row has a large inclination. In FIG. 4, the arrow direction represents the off-axis telecentric direction (direction in which light is condensed), and the size of the arrow represents the degree of the off-axis telecentricity.

Figure 5:
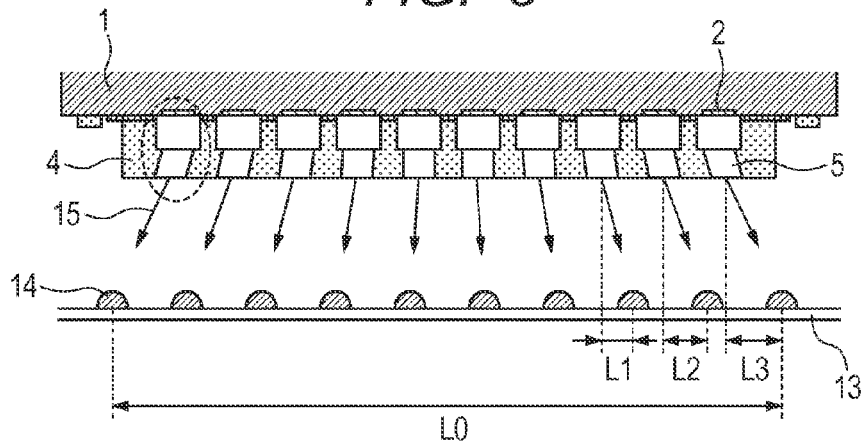
FIG. 5 is a schematic sectional view illustrating an ejection orifice row of the ink jet recording head formed with use of the related art, and is a schematic view illustrating a state of ink droplets landing onto a recording medium.
Figure 6A:
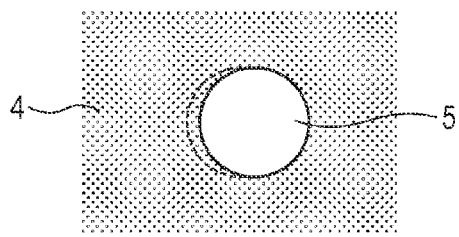
FIG. 6A is an enlarged top view of a region around the ejection orifice surrounded by the dotted lines illustrated in FIG. 5.
Figure 6B:
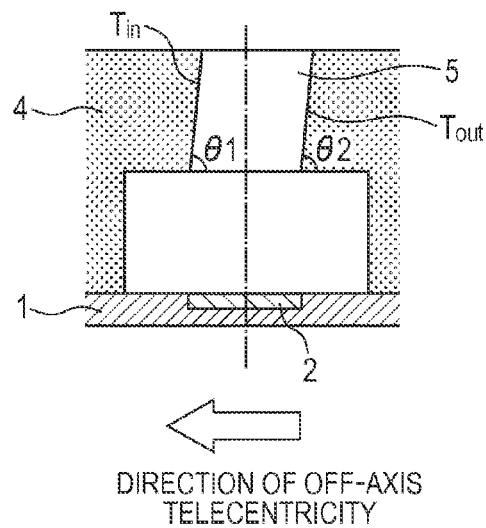
FIG. 6B is an enlarged sectional view of the region around the ejection orifice surrounded by the dotted lines illustrated in FIG. 5.

FIG. 5 is a sectional view in the direction perpendicular to the substrate surface, which is taken along the line along the ejection orifice row (see line A-A in FIG. 1) in the related-art ink jet recording head, and is a schematic view illustrating a state of ejection and landing onto the recording medium 13. FIG. 6A is an enlarged top view of a region around the ejection orifice surrounded by the dotted lines illustrated in FIG. 5, and FIG. 6B is an enlarged sectional view of the region around the ejection orifice surrounded by the dotted lines illustrated in FIG. 5.

As illustrated in FIG. 5, when the latent images of the ejection orifices are formed with use of the reduction projection exposing apparatus, inclination is generated in the ejection orifice formed by the light beam that has passed through the vicinity of the outer periphery of the reticle (vicinity of the edge of the lens). Therefore, in the ink jet recording head having the related-art form, inclination is generated in the ejection orifice in the vicinity of the end portion of the ejection orifice row, and the ejection direction 15 is inclined from the perpendicular direction. As a result, the landing position of the liquid droplet 14 may be misaligned. That is, when the center position of the reticle 11 and the center position of the substrate are located at the same position in the horizontal direction, as the ejection orifice is closer to the end portion of the ejection orifice row, the inclination of the ejection orifice 5 is generated through exposure of the light beam that has passed on the outer periphery side of the reticle 11, and hence the inclination of the ejection orifice 5 and the landing position misalignment increase.

The landing position misalignment amount with respect to the recording medium 13 changes depending on the inclination of the ejection orifice 5, and a relationship of L1<L2<L3 is attained (FIG. 5).

Figure 7:
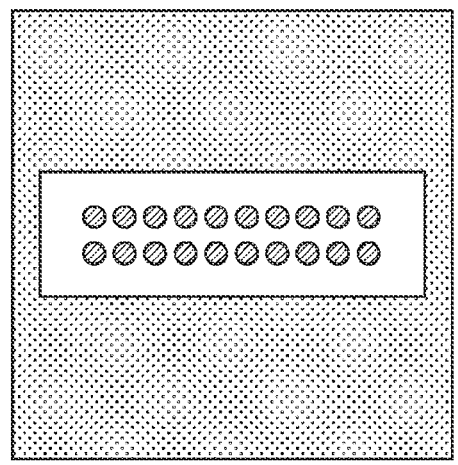
FIG. 7 is a schematic plan view illustrating a reticle having a mask pattern of the ejection orifice row in a related-art method of manufacturing an ink jet recording head.

Further, liquid droplets 14 ejected from ejection orifices at both the end portions of the ejection orifice row fly so as to incline outwardly (direction toward the center of the ejection orifice row is referred to as "inward direction"), and hence a total printing pitch L0 (FIG. 5) with respect to the recording medium 13 also expands. This is because, when a latent image pattern for the ejection orifices 5 is formed through intermediation of the reticle 11 with use of i-line light, a reticle having a mask pattern as illustrated in FIG. 7 is used for exposure, but due to the off-axis telecentricity caused by the reduction projection exposing apparatus, the ejection orifices 5 are formed so as to incline outwardly from the perpendicular direction as illustrated in FIGS. 6A and 6B. In the sectional view of the ejection orifice illustrated in FIG. 6B, among side walls on both sides of the ejection orifice, a side wall arranged in the inward direction is referred to as "inner side wall $T_{in}$," and a side wall arranged in the outward direction is referred to as "outer side wall $T_{out}$". Further, θ1 represents an angle between the inner side wall $T_{in}$ and the substrate surface (horizontal surface), and θ2 represents an angle between the outer side wall $T_{out}$ and the substrate surface. In FIG. 6B, due to the off-axis telecentricity, the inner side wall $T_{in}$ and the outer side wall $T_{out}$ are formed so as to incline outwardly from the perpendicular direction, and θ1 and θ2 are 90° or less. Both of the inner side wall $T_{in}$ and the outer side wall $T_{out}$ are inclined outwardly, and hence the ejection direction of the ejection orifice is inclined outwardly. Note that, in the above description, the inward direction matches with the off-axis telecentric direction, and the outward direction matches with a direction opposite to the off-axis telecentric direction.

Figure 8A:
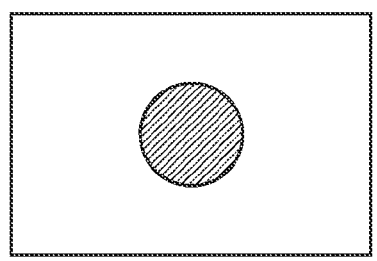
FIG. 8A is an enlarged plan view illustrating an ejection orifice mask shape in the mask pattern of the reticle illustrated in FIG. 7.
Figure 8B:
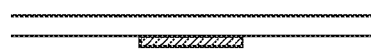
FIG. 8B is a side view of the ejection orifice mask shape.

Note that, FIG. 8A is an enlarged view of the ejection orifice mask shape corresponding to the ejection orifices in the mask pattern of the reticle illustrated in FIG. 7, and FIG. 8B is a side view of the ejection orifice mask shape.

In view of this, it is an object of embodiments of the present invention to prevent landing position misalignment by correcting the inclination of the ejection direction to be caused by the off-axis telecentricity, and more preferably, to also prevent the expansion of the total printing pitch.

First Embodiment

Now, the embodiments of the present invention are described.

Figure 9:
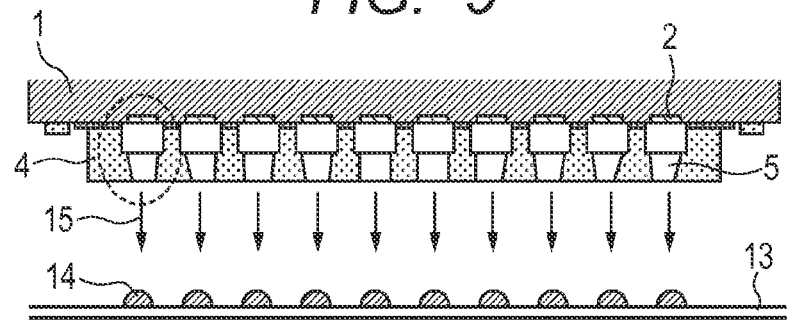
FIG. 9 is a schematic sectional view illustrating an ejection orifice row of an ink jet recording head obtained by a manufacturing method according to an embodiment of the present invention, and is a schematic view illustrating a state of ink droplets landing onto the recording medium.
Figure 10A:
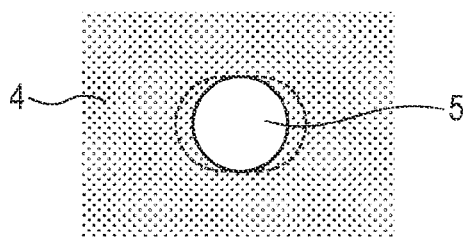
FIG. 10A is an enlarged top view of a region around the ejection orifice surrounded by the dotted lines illustrated in FIG. 9.

FIG. 9 is a schematic sectional view illustrating a structure of an ink jet recording head manufactured by a manufacturing method according to an embodiment of the present invention. FIG. 9 is a sectional view taken along a line corresponding to the line A-A of FIG. 1, and is a schematic view illustrating the state of ejection and landing onto the recording medium 13. FIG. 10A is an enlarged top view of a region around the ejection orifice surrounded by the dotted lines illustrated in FIG. 9, and FIG. 10B is an enlarged sectional view of the region around the ejection orifice surrounded by the dotted lines illustrated in FIG. 9.

In this embodiment, even at positions at which the degree of the off-axis telecentricity is large, the outer side wall of the ejection orifice is formed so as to incline inwardly by the mask shape of the reticle. With this, the ejection direction of the ejection orifice can be corrected.

Figure 11:
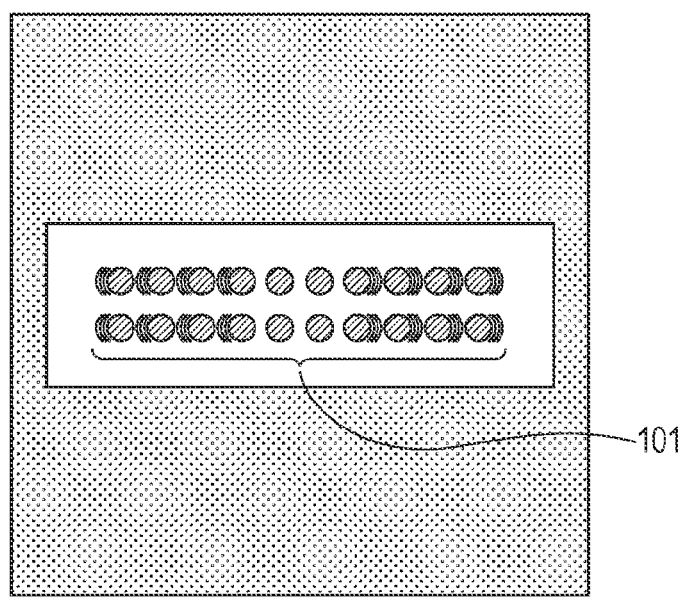
FIG. 11 is a schematic plan view of a reticle used in a first embodiment of the present invention.
Figure 12A:
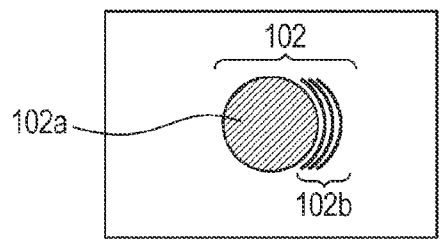
FIG. 12A is an enlarged plan view illustrating an ejection orifice mask shape in the reticle of FIG. 11.
Figure 12B:
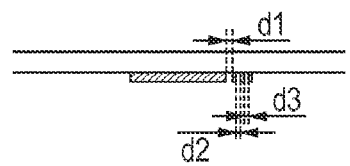
FIG. 12B is a side view of the ejection orifice mask shape.

FIG. 11 illustrates a reticle having a mask pattern 101 for the ejection orifice rows, which is used in this embodiment. FIG. 12A is an enlarged view of a mask shape 102 of a portion of the mask pattern 101 for the ejection orifice rows illustrated in FIG. 11, which corresponds to a single ejection orifice. FIG. 12B is a side view of the mask shape 102.

Figure 10B:
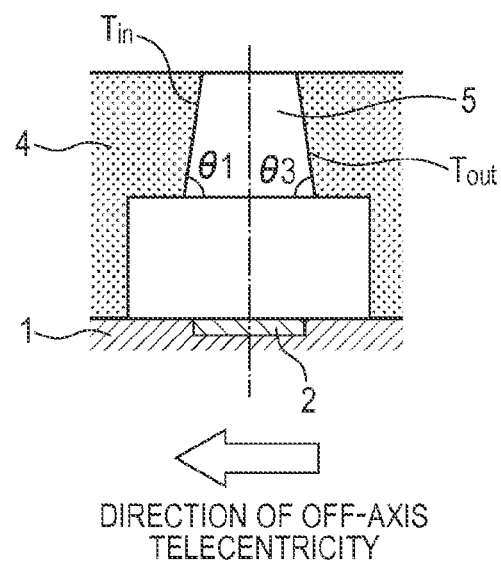
FIG. 10B is an enlarged sectional view of the region around the ejection orifice surrounded by the dotted lines illustrated in FIG. 9.

Further, FIG. 10B is a sectional view of the ejection orifice obtained in this embodiment, and is a view corresponding to FIG. 6B. In FIG. 10B, the outer side wall $T_{out}$ is inclined inwardly from the direction perpendicular to the substrate surface. Note that, θ3 represents an angle between the outer side wall $T_{out}$ and the substrate surface. θ1 represents an angle of the inner side wall on the off-axis telecentric direction side among the side walls of the ejection orifice in the sectional shape of the ejection orifice taken along a plane parallel to the off-axis telecentric direction and perpendicular to the substrate surface. It is preferred that the angle difference between θ1 and θ3 be 1° or less. Further, it is preferred that θ3 be 90° or less. In FIG. 10B, it is preferred that the outer side wall $T_{out}$ incline in the off-axis telecentric direction (inwardly) from the direction perpendicular to the substrate surface.

The mask pattern 101 for the ejection orifice rows is more affected by the off-axis telecentricity toward the end portion of the mask pattern (toward the outer side). Therefore, the ejection orifice located closer to the end portion of the ejection orifice row is formed to incline more outwardly from the direction perpendicular to the substrate surface, and tends to have more inclined ejection angle. Therefore, in this embodiment, with use of the ejection orifice mask shape 102 as illustrated in FIGS. 12A and 12B, the ejection angle of the ejection orifice is corrected as illustrated in FIGS. 10A and 10B.

The ejection orifice mask shape 102 includes a mask portion 102a corresponding to an upper opening of the ejection orifice, and a slit mask portion 102b for forming the outer side wall. The slit mask portion 102b is provided on the outward side (opposite side to the off-axis telecentric direction) of the mask portion 102a. The mask portion 102a substantially corresponds to a portion that forms the upper opening of the ejection orifice and the inner side wall $T_{in}$, and the slit mask portion 102b substantially corresponds to a portion that forms the outer side wall $T_{out}$.

When the ejection orifice mask shape 102 only includes the mask portion 102a, as in the related-art ink jet recording head as illustrated in FIGS. 6A and 6B, the side walls on both sides of the ejection orifice (inner side wall and outer side wall) are formed so as to incline outwardly. On the other hand, the ejection orifice mask shape 102 of this embodiment includes the mask portion 102a and the slit mask portion 102b for forming the outer side wall, and hence, as illustrated in FIGS. 10A and 10B, the outer side wall $T_{out}$ can be formed so as to incline inwardly. With this, the ejection angle of the obtained ejection orifice can be corrected so as to be close to the direction perpendicular to the substrate surface.

The slit mask portion 102b has a shape in which multiple light blocking portions are provided in a slit manner on the outward side of the mask portion 102a corresponding to the upper opening. The light blocking portion of the slit mask portion is not particularly limited, but the light blocking portion is preferred to have a curved shape along the outer edge of the mask portion 102a.

In FIGS. 12A and 12B, on the outward side of the mask portion 102a, three light blocking portions are provided in a slit manner as the slit mask portion. The three slit light blocking portions are referred to as a first light blocking portion, a second light blocking portion, and a third light blocking portion in order from the mask portion 102a side. In FIG. 12B, d1 represents an interval between the mask portion 102a and the first light blocking portion, d2 represents an interval between the first light blocking portion and the second light blocking portion, and d3 represents an interval between the second light blocking portion and the third light blocking portion.

As illustrated in FIGS. 10A and 10B, in this embodiment, the ejection angle that inclines due to the off-axis telecentricity of the reduction projection exposing apparatus can be corrected in each ejection orifice. With this, it is possible to prevent the misalignment in landing position onto the recording medium 13 and the total printing pitch from being enlarged. In this manner, when the pattern for the ejection orifices 5 is formed through intermediation of the reticle 11 with use of the reduction projection exposing apparatus, the ejection angle is corrected through exposure with the reticle illustrated in FIGS. 11, 12A, and 12B. As illustrated in FIG. 11, in the vicinity of the center of the reticle that is less affected by the off-axis telecentricity, a mask shape similar to that of the related-art reticle illustrated in FIGS. 8A and 8B can be used. In the vicinity of the outer periphery of the reticle that is more affected by the off-axis telecentricity, with use of the mask pattern having the slit mask portion as illustrated in FIGS. 12A and 12B, exposure for forming the ejection orifices is performed. The ejection angle can be appropriately corrected by adjusting the inclination of the outer side wall by adjusting the pitch widths d1, d2, and d3 of light transmitting portions between the light blocking portions in accordance with the level of influence of the off-axis telecentricity. By arranging, in the ejection orifice row direction, the ejection orifice mask shape having the slit mask portion that is changed depending on the influence of the off-axis telecentricity on each ejection orifice, the ejection angle of the ejection orifice can be individually corrected in the row.

The inclination of the outer side wall can be appropriately adjusted by the shape and width of the light blocking portion of the slit mask portion and the above-mentioned widths d1 to d3. For example, when the width of the light blocking portion of the slit mask portion is 1,000 nm, and the relationship of the widths d1, d2, and d3 of the light transmitting portions is set so that d1 is fixed to 2,000 nm and d2 and d3 are expanded or so that d2 and d3 are fixed to 1,400 nm and d1 is expanded, the outer side wall can be inclined inwardly to reduce θ3. Further, when the relationship of d1 to d3 is set so that d1 is fixed to 400 nm and d2 and d3 are expanded or so that d2 and d3 are fixed to 600 nm and d1 is expanded, θ3 increases. That is, it is generally difficult to adjust the angle θ3 only with the size of the width of the light transmitting portion, and the width relationship of the light transmitting portions of d1 to d3 is important.

Further, when the widths d1 to d3 of the light transmitting portions are 1,000 nm and the width of the slit light blocking portion is increased, θ3 tends to increase, while when the width of the slit light blocking portion is decreased, θ3 tends to reduce to cause inward inclination.

In the outer periphery portion of the reticle that is more affected by the off-axis telecentricity, with use of the width relationship of the light transmitting portions of d1 to d3 described above, the angle to be corrected increases. Even in a portion on the inner side of the outer periphery portion of the reticle, with use of the width relationship of the light transmitting portions of d1 to d3 described above, the angle to be corrected decreases.

With this embodiment, when forming the ejection orifices with use of the reduction projection exposing apparatus, it is possible to prevent landing position misalignment due to the telecentric property and to reduce the total printing pitch.

Second Embodiment

Now, a second embodiment of the present invention is described.

In this embodiment, even at positions at which the degree of the off-axis telecentricity is large, the outer side wall of the ejection orifice is formed so as to incline inwardly by the mask shape of the reticle. With this, the ejection direction of the ejection orifice can be corrected.

Figure 13:
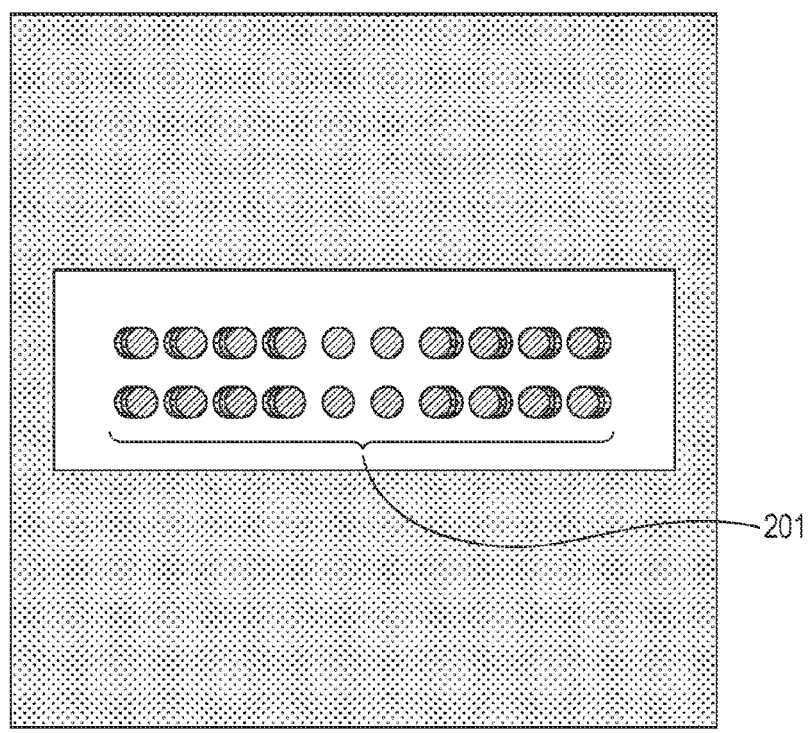
FIG. 13 is a schematic plan view of a reticle used in a second embodiment of the present invention.
Figure 14A:
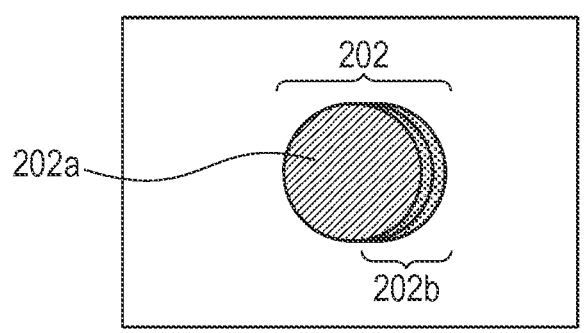
FIG. 14A is an enlarged plan view illustrating an ejection orifice mask shape in the reticle of FIG. 13.
Figure 14B:
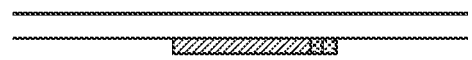
FIG. 14B is a side view of the ejection orifice mask shape.

FIG. 13 illustrates a reticle having a mask pattern 201 for the ejection orifice rows, which is used in this embodiment. FIGS. 14A and 14B are enlarged views of a mask shape 202 of a portion of the mask pattern 201 for the ejection orifice rows illustrated in FIG. 13, which corresponds to a single ejection orifice.

Further, FIG. 10B is a sectional view of the ejection orifice obtained in this embodiment, and is a view corresponding to FIG. 6B. In FIG. 10B, the outer side wall $T_{out}$ is inclined inwardly from the direction perpendicular to the substrate surface. Note that, θ3 represents an angle between the outer side wall $T_{out}$ and the substrate surface. It is preferred that the angle difference between θ1 and θ3 be 1° or less. Further, it is preferred that θ3 be 90° or less. In FIG. 10B, it is preferred that the outer side wall $T_{out}$ incline in the off-axis telecentric direction (inwardly) from the direction perpendicular to the substrate surface.

The mask pattern 201 for the ejection orifice rows is more affected by the off-axis telecentricity toward the end portion of the mask pattern (toward the outer side). Therefore, the ejection orifice located closer to the end portion of the ejection orifice row is formed to incline more outwardly from the direction perpendicular to the substrate surface, and tends to have more inclined ejection angle. Therefore, in this embodiment, with use of the ejection orifice mask shape 202 as illustrated in FIGS. 14A and 14B, the ejection angle of the ejection orifice is corrected as illustrated in FIGS. 10A and 10B.

The ejection orifice mask shape 202 includes a mask portion 202a corresponding to an upper opening of the ejection orifice, and a gradation mask portion 202b for forming the outer side wall. The gradation mask portion 202b is provided on the outward side (opposite side to the off-axis telecentric direction) of the mask portion 202a. The mask portion 202a substantially corresponds to a portion that forms the upper opening of the ejection orifice and the inner side wall $T_{in}$, and the gradation mask portion 202b substantially corresponds to a portion that forms the outer side wall $T_{out}$.

When the ejection orifice mask shape 202 only includes the mask portion 202a, as in the related-art ink jet recording head as illustrated in FIGS. 6A and 6B, the side walls on both sides of the ejection orifice (inner side wall and outer side wall) are formed so as to incline outwardly. On the other hand, the ejection orifice mask shape 202 of this embodiment includes the mask portion 202a and the gradation mask portion 202b for forming the outer side wall, and hence, as illustrated in FIGS. 10A and 10B, the outer side wall $T_{out}$ can be formed so as to incline inwardly. With this, the ejection angle of the obtained ejection orifice can be corrected so as to be close to the direction perpendicular to the substrate surface.

The gradation mask portion 202b can be formed so as to gradually reduce the light blocking degree toward the outer edge of the gradation mask portion from the boundary with the mask portion 202a. The light blocking degree is smaller than the light blocking degree of the mask portion 202a, and may be reduced in a stepwise manner or reduced with a gentle inclination.

In this embodiment, with use of the reduction projection exposing apparatus, through exposure of the reticle pattern illustrated in FIGS. 13, 14A, and 14B, the ejection angle of the ejection orifice is corrected. As illustrated in FIG. 13, in the vicinity of the center of the reticle that is less affected by the off-axis telecentricity, a mask shape similar to that of the related-art reticle illustrated in FIGS. 8A and 8B can be used. In the vicinity of the outer periphery of the reticle that is more affected by the off-axis telecentricity, with use of the mask pattern having the gradation mask portion as illustrated in FIG. 13, exposure for forming the ejection orifices is performed. By arranging, in the ejection orifice row direction, the ejection orifice mask shape having the gradation mask portion that is adjusted in light transmittance depending on the level of influence of the off-axis telecentricity, the ejection angle of the ejection orifice can be individually corrected in the row. The adjustment of the ejection orifice angle by the gradation mask is made by adjusting the dot diameter and region size of the gradation portion.

The inclination of the outer side wall can be appropriately adjusted by the shape and width of the light blocking portion of the gradation mask portion and the degree of the gradation.

With this embodiment, when forming the ejection orifices with use of the reduction projection exposing apparatus, it is possible to prevent landing position misalignment due to the telecentric property and to reduce the total printing pitch.

According to the configuration of the present invention, even when the reduction projection exposing apparatus is used, it is possible to manufacture the liquid ejection head while suppressing the inclination in the ejection direction of the ejection orifice due to the off-axis telecentricity. In addition, it is possible to provide the method of manufacturing a liquid ejection head capable of preventing reduction in image quality.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2013-121538, filed Jun. 10, 2013, which is hereby incorporated by reference herein in its entirety.

What is claimed is:

1. A method of manufacturing a liquid ejection head including: a substrate including energy generating elements for generating energy to eject liquid; ejection orifices for ejecting the liquid; and a liquid flow path communicated to the ejection orifices, the method comprising:
    forming, on the substrate, a flow path mold pattern that is formed as a mold of the liquid flow path;
    forming a negative photosensitive resin layer on the flow path mold pattern;
    subjecting the negative photosensitive resin layer to exposure processing with use of a reduction projection exposing apparatus and a mask pattern having an ejection orifice mask shape for forming the ejection orifices; and
    subjecting the negative photosensitive resin layer obtained after the exposure processing to development processing to form the ejection orifices,
    wherein the ejection orifices are formed by correcting, by the ejection orifice mask shape, an inclination of an ejection angle due to an off-axis telecentricity caused by the reduction projection exposing apparatus so as to be close to a direction perpendicular to a surface of the substrate.

2. The method according to claim 1, wherein the ejection orifice mask shape includes a mask portion corresponding to an upper opening of each of the ejection orifices and a slit mask portion provided on an opposite side to an off-axis telecentric direction of the mask portion.

3. The method according to claim 2, wherein the ejection orifices are formed so that, in a sectional shape of the each of the ejection orifices taken along a plane parallel to the off-axis telecentric direction and perpendicular to the surface of the substrate, when $\theta 1$ represents an angle of an inner side wall on the off-axis telecentric direction side among side walls of the each of the ejection orifices, and $\theta 3$ represents an angle of an outer side wall on an opposite side to the off-axis telecentric direction among the side walls, an angle difference between $\theta 1$ and $\theta 3$ is 1° or less, and the outer side wall is inclined in the off-axis telecentric direction from the direction perpendicular to the surface of the substrate.

4. The method according to claim 1, wherein the ejection orifice mask shape includes a mask portion corresponding to an upper opening of each of the ejection orifices and a gradation mask portion provided on an opposite side to an off-axis telecentric direction of the mask portion.

5. The method according to claim 4, wherein the ejection orifices are formed so that, in a sectional shape of the each of the ejection orifices taken along a plane parallel to the off-axis telecentric direction and perpendicular to the surface of the substrate, when $\theta 1$ represents an angle of an inner side wall on the off-axis telecentric direction side among side walls of the each of the ejection orifices, and $\theta 3$ represents an angle of an outer side wall on an opposite side to the off-axis telecentric direction among the side walls, an angle difference between $\theta 1$ and $\theta 3$ is 1° or less, and the outer side wall is inclined in the off-axis telecentric direction from the direction perpendicular to the surface of the substrate.

6. The method according to claim 1, wherein the ejection orifices are formed so that, in a sectional shape of each of the ejection orifices taken along a plane parallel to an off-axis telecentric direction and perpendicular to the surface of the substrate, when $\theta 1$ represents an angle of an inner side wall on the off-axis telecentric direction side among side walls of the each of the ejection orifices, and $\theta 3$ represents an angle of an outer side wall on an opposite side to the off-axis telecentric direction among the side walls, an angle difference between $\theta 1$ and $\theta 3$ is 1° or less, and the outer side wall is inclined in the off-axis telecentric direction from the direction perpendicular to the surface of the substrate.

* * * * *